United States Patent
Jordan

(10) Patent No.: US 6,304,092 B1
(45) Date of Patent: Oct. 16, 2001

(54) SELF-ALIGNING DOCKING ASSEMBLY FOR SEMICONDUCTOR TESTER

(75) Inventor: James R. Jordan, Portland, OR (US)

(73) Assignee: Credence Systems Corporation, Fremont, CA (US)

( * ) Notice: Subject to any disclaimer, the term of this patent is extended or adjusted under 35 U.S.C. 154(b) by 0 days.

(21) Appl. No.: 09/493,520

(22) Filed: Jan. 28, 2000

(51) Int. Cl.[7] .................................................. G01R 31/02
(52) U.S. Cl. ...................... 324/758; 324/765; 324/158.1
(58) Field of Search .................................. 324/758, 754, 324/760, 761, 762, 755, 158.1, 73.1, 765

(56) References Cited

U.S. PATENT DOCUMENTS

| | | | |
|---|---|---|---|
| 5,489,853 | * | 2/1996 | Nakajima ............................. 324/754 |
| 5,656,943 | * | 8/1997 | Montoya et al. ..................... 324/754 |
| 5,670,889 | * | 9/1997 | Okubo et al. ........................ 324/760 |

* cited by examiner

Primary Examiner—Ernest Karlsen
Assistant Examiner—Minh Tang
(74) Attorney, Agent, or Firm—John Smith-Hill; Smith-Hill and Bedell

(57) ABSTRACT

A mechanical interface between the test head of a semiconductor integrated circuit tester and a wafer prober includes docking bars which are releasably attached to a docking plate of the wafer prober and an interface member between the test head and the docking plate. The interface member and the docking bars have complementary alignment features which can be brought into engagement and, when so engaged, ensure that the docking bars are in predetermined relative position.

7 Claims, 2 Drawing Sheets

SELF-ALIGNING DOCKING ASSEMBLY FOR SEMICONDUCTOR TESTER

BACKGROUND OF THE INVENTION

This invention relates to a self-aligning docking assembly for a semiconductor tester.

A semiconductor integrated circuit (IC) tester typically includes a test head having a test head body which accommodates pin electronics for carrying out test activities at each of a plurality of terminals of the pin electronics. Such a tester can be used in conjunction with a wafer prober for testing semiconductor integrated circuits embodied in a wafer prior to dicing of the wafer into individual integrated circuit chips. The wafer prober includes a docking plate which is formed with a circular hole and an insert ring is loosely fitted in the hole in the docking plate. Two docking bars are attached to the docking plate so that the hole in which the insert ring is fitted is between the docking bars. The insert ring and the docking bars are parts of a mechanical interface between a particular wafer prober and a particular test head. A probe card is located in the insert ring and is aligned relative to the insert ring by engagement of alignment bores of the probe card with alignment pins of the insert ring. The probe card has probe wires for engaging contact pads of at least one chip. The wafer prober also includes a mechanism for bringing successive wafers to a test station, adjusting the position of the wafer at the test station stepwise to permit engagement of the probe wires successively with all the chips of the wafer and then removing the wafer from the test station to allow another wafer to be positioned at the test station.

The test head includes a load board and a so-called pogo tower, which accommodates an array of pogo pins. A traction mechanism pulls the test head towards the docking plate along a Z axis and the test head is positioned relative to the wafer prober along X and Y axes by engagement of alignment pins carried by the test head with alignment bores formed in the docking bars. When the test head is properly docked with the wafer prober, the insert ring is aligned relative to the test head body with a high degree of precision and the terminals of the pin electronics are electrically coupled to the probe wires of the probe card through the load board and the pogo tower.

A small tolerance is permitted in relative positioning of the docking bars relative to the docking plate, because the mechanism used for positioning the wafer allows minor adjustment in the XY position of the wafer, but it is important that the docking bars be accurately positioned relative to each other since otherwise the alignment pins of the test head will not properly engage the alignment bores of the docking bars and the test head will not be brought to the proper position relative to the docking plate. Adjustment in the relative positions of the docking bars is generally accomplished using a calibration bar having alignment pins which engage the alignment bores of the docking bars. Thus, prior to engagement of the test head with the wafer prober, the calibration bar is applied to the docking bars while the docking bars are attached loosely to the docking plate. The docking bars are brought to the correct relative positions with the aid of the calibration bar and are then secured tightly to the docking plate. When the test head is properly engaged with the docking bars, the pogo pins engage the probe card.

Several different calibration bars may be needed for positioning the docking bars of a given wafer prober, depending on the tester with which the prober is being used at the time. Further, because of minor design changes in testers and wafer probers, the calibration bar for a given combination of wafer prober and tester might not be usable with another wafer prober of the same model and/or another tester of the same model. Consequently, in a large testing facility, there may be a need for numerous calibration bars which appear very similar but are in fact different. If one of the calibration bars should be lost or damaged, it would generally be necessary to make another calibration bar, and this is a time consuming and expensive operation.

In the conventional wafer prober, the insert ring is not constrained relative to the docking bars except by virtue of both the insert ring and the docking bars being constrained relative to the docking plate. When the test head is docked with the wafer prober, the insert ring is precisely positioned relative to the docking bars by virtue of both the insert ring and the docking bars being precisely positioned relative to the test head.

SUMMARY OF THE INVENTION

In accordance with the invention there is provided apparatus for testing semiconductor integrated circuit devices, comprising a wafer prober including a docking plate, a semiconductor integrated circuit tester including a test head, and a mechanical interface between the test head and the wafer prober, the mechanical interface including docking bars, a releasable means for attaching the docking bars to the docking plate, and an interface member between the test head and the docking plate, and wherein the test head has a body, a terminal support structure for positioning terminals of the test head relative to the body of the test head, alignment elements for engaging the docking bars if the docking bars are in predetermined relative positions for ensuring that the body of the test head is properly positioned relative to the docking bars, and an attachment mechanism for securing the test head to the wafer prober, and wherein the interface member and the docking bars have complementary alignment features which can be brought into engagement and, when so engaged, ensure that the docking bars are in said predetermined relative positions.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

Figure 1:
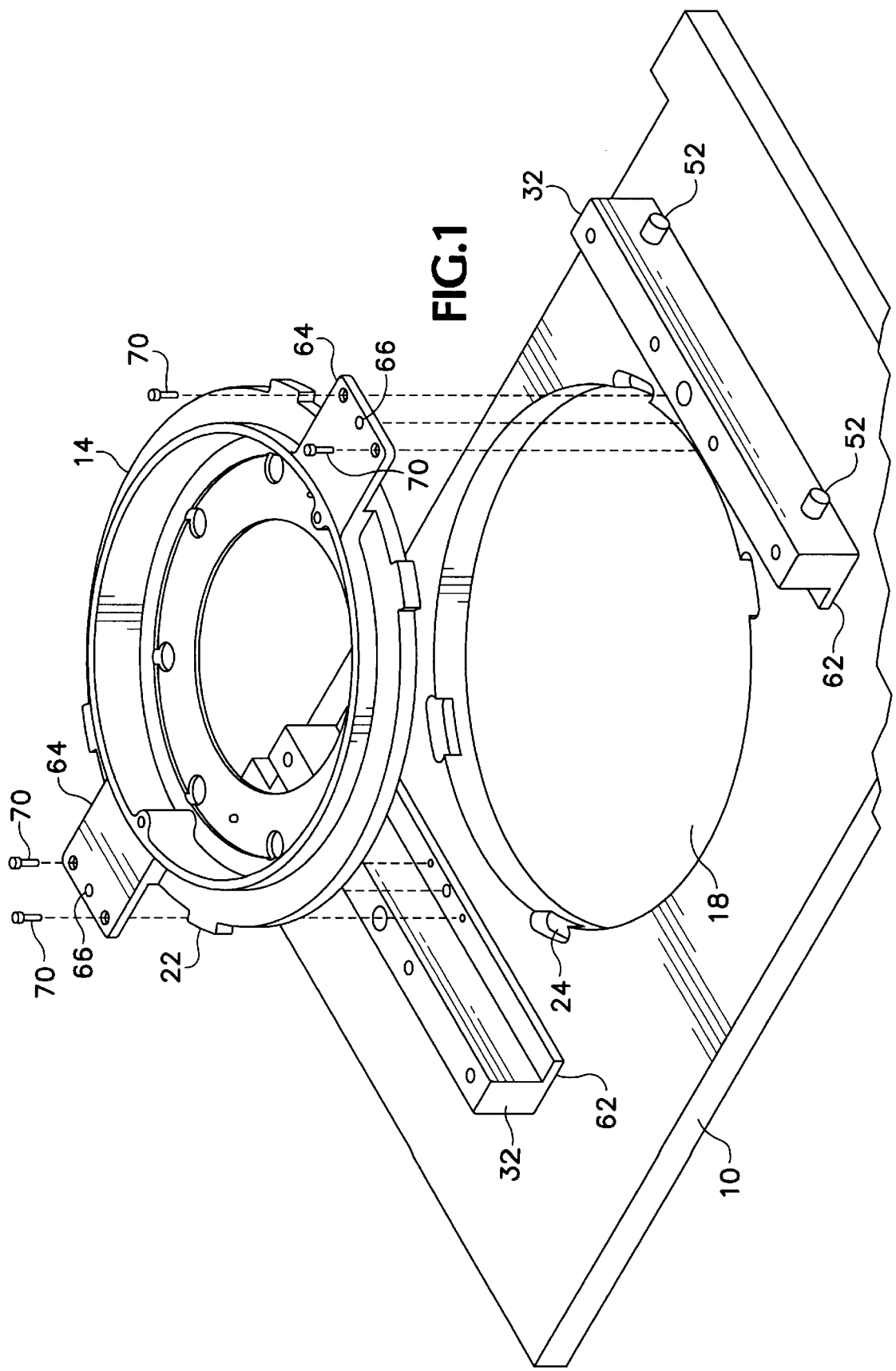
FIG. 1 is a partial perspective exploded view of a wafer prober including a docking plate and two docking bars attached to the docking plate.
Figure 2:
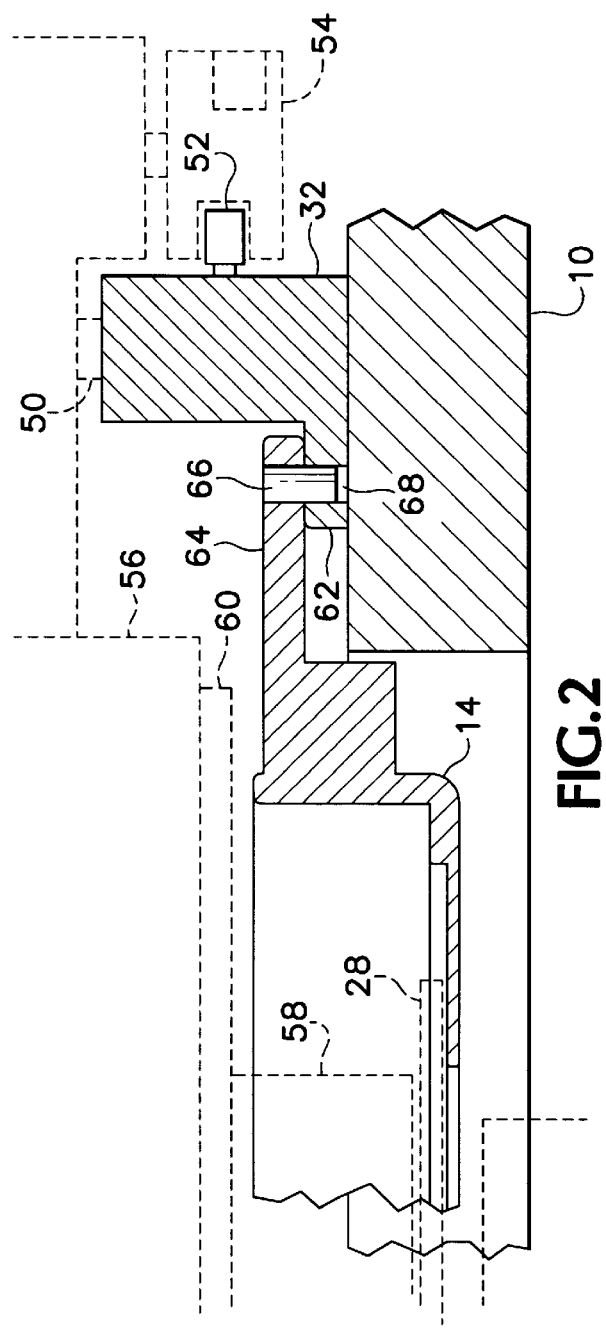
FIG. 2 is an enlarged sectional view illustrating an insert ring fitted in a hole in the docking plate.
Figure 3:
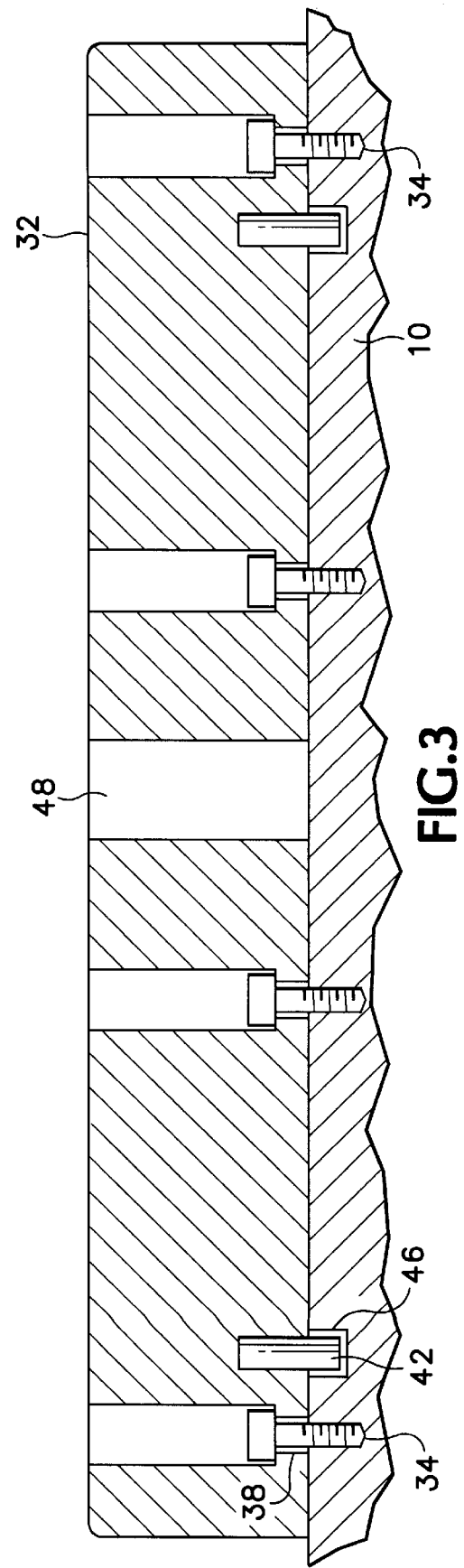
FIG. 3 is an enlarged sectional view of one of the docking bars.

FIGS. 1–3 illustrate a docking plate 10 which is attached to a wafer prober frame (not shown). Two docking bars 32 are attached to the docking plate 10 by screws 34, which are threaded through holes 38 in the docking bar, the holes 38 being sufficiently large to allow a small degree of play of the docking bar relative to the docking plate. Alignment pins 42 project downwards from the docking bars into oversized sockets 46 for rough positioning of the docking bars relative to the docking plate prior to inserting the screws 34.

An insert ring 14 is positioned in a circular hole 18 in the docking plate, the insert ring being loosely aligned relative to the docking plate by projections 22 fitting in recesses 24. A probe card 28 is fitted in the insert ring and is positioned with a high degree of precision relative to the insert ring by alignment pins of the insert ring engaging alignment bores of the probe card.

Two cam followers 52 project from each docking bar for engaging with respective rotary cams 54 which are attached to the test head. The cam followers and the rotary cams form a traction mechanism for drawing the test head into engagement with the wafer prober.

The docking bars 32 are formed with alignment bores 48 for receiving alignment pins 50 attached to the test head when the test head is drawn into engagement with the docking plate. For proper engagement, the two docking bars must be at the proper relative positions.

The test head includes a test head body 56 and a pogo tower 58 which is attached to the body 56. A load board 60 is held between the pogo tower and the body 56. The load board 60 provides an electrical interface between the terminals of the pin electronics and the pogo pins of the pogo tower.

The insert ring 14 serves as a mechanical interface between the wafer prober and a particular test head. When the traction mechanism draws the test head towards the docking plate, the pogo tower engages the probe card and the electrical interface between the pin electronics and the chip is completed. The structure of the test head and wafer prober, as described so far, is conventional.

Each docking bar 32 includes a flange 62 which projects towards the other docking bar and the insert ring 14 has external flanges 64 which project over the flanges 62 of the docking bars 32. Pins 66 project downwards from the flange 64 and the flanges 62 are formed with respective alignment bores 68 for receiving the pins 66.

In order to prepare the wafer prober for engagement with a particular test head, the docking bars for interfacing to the particular test head are attached to the docking plate 10 but the screws 34 are left loose to allow limited movement of the docking bars relative to the docking plates. The insert ring for the particular test head is fitted to the docking bars so that the pins 66 engage the alignment bores 68. The insert ring is then attached to the docking bars by the screws 70. In this manner, the docking bars are brought to precisely defined relative positions. The screws 34 are then tightened, securing the docking bars to the docking plate without disturbing the relative positions of the docking bars. When the traction mechanism draws the test head towards the docking plate, the alignment pins 50 will engage the alignment bores 48 and the pogo tower will be properly positioned relative to the probe card.

It will be seen from the foregoing that the alignment pins 66 attached to the flanges 64 of the insert ring and the bores 68 in the flanges 62 of the docking bars allow the docking bars to be brought to the correct relative positions for the particular test head without need for a separate calibration bar. This simplifies setup of the wafer prober and avoids the need for a calibration bar, and the attendant possibility of using the wrong calibration bar and consequently positioning the docking bars in the wrong relative positions.

It will be appreciated that the invention is not restricted to the particular embodiment that has been described, and that variations may be made therein without departing from the scope of the invention as defined in the appended claims and equivalents thereof.

What is claimed is:

1. Apparatus for testing semiconductor integrated circuit devices, comprising:

a wafer prober including a docking plate, a semiconductor integrated circuit tester including a test head, and a mechanical interface between the test head and the wafer prober, the mechanical interface including docking bars, a releasable means for attaching the docking bars to the docking plate, and an interface member between the test head and the docking plate, wherein the test head has a body, alignment elements for engaging the docking bars if the docking bars are in predetermined relative positions for ensuring that the body of the test head is properly positioned relative to the docking bars, and an attachment mechanism for securing the test head to the wafer prober, and wherein the interface member and the docking bars have complementary alignment features which can be brought into engagement and, when so engaged, ensure that the docking bars are in said predetermined relative positions.

2. Apparatus according to claim 1, wherein the interface member is an insert ring for receiving a probe card, the insert ring has two radial flanges which extend at least partially over the docking bars respectively, and each radial flange and the docking bar over which it extends have the complementary alignment features.

3. Apparatus according to claim 2, wherein each docking bar has a main body formed with an alignment bore, the alignment elements of the test head are alignment pins attached to the test head body for engaging the alignment bores of the docking bars respectively, and each docking bar further includes a flange extending from the body of the docking bar and over which the flange of the insert ring extends.

4. Apparatus according to claim 3, wherein said complementary alignment features comprise an alignment pin projecting from each radial flange and an alignment bore formed in the flange of the docking bar.

5. Apparatus according to claim 1, wherein the releasable means has a first condition in which it allows a limited range of movement of the docking bars relative to the docking plate while retaining the docking bars captive relative to the docking plate and a second condition in which it locks the docking bars against movement relative to the docking plate.

6. Apparatus according to claim 1, wherein the test head has a terminal support structure for positioning terminals of the test head relative to the body of the test head and wherein the interface member is an insert ring and the apparatus comprises a probe card fitted in the insert ring and providing an electrical interface between the terminals of the test head and a wafer at a test station.

7. Apparatus according to claim 1, wherein the test head has a terminal support structure for positioning terminals of the test head relative to the body of the test head and wherein the terminal support structure includes a pogo tower having pogo pins which serve as the terminals of the test head.

\* \* \* \* \*